US007989963B2

(12) United States Patent
Tam

(10) Patent No.: US 7,989,963 B2
(45) Date of Patent: Aug. 2, 2011

(54) TRANSISTOR CIRCUIT FORMATION SUBSTRATE

(75) Inventor: Simon Tam, Cambridgeshire (GB)

(73) Assignee: Seiko Epson Corporation, Tokyo (JP)

( * ) Notice: Subject to any disclaimer, the term of this patent is extended or adjusted under 35 U.S.C. 154(b) by 113 days.

(21) Appl. No.: 12/076,187

(22) Filed: Mar. 14, 2008

(65) Prior Publication Data
US 2008/0224332 A1    Sep. 18, 2008

(30) Foreign Application Priority Data
Mar. 16, 2007   (GB) .................................. 0705132.9

(51) Int. Cl.
*H01L 23/48* (2006.01)

(52) U.S. Cl. .......... 257/786; 257/506; 257/508; 257/40; 257/E51.002; 257/E25.008; 438/129; 438/99

(58) Field of Classification Search .................. 438/110, 438/125, 129, FOR. 405, 99; 257/506, 508, 257/786, 40, E51.002, E25.008
See application file for complete search history.

(56) References Cited

U.S. PATENT DOCUMENTS

| | | | |
|---|---|---|---|
| 2004/0119903 A1* | 6/2004 | Chang et al. ..................... 349/43 |
| 2006/0043359 A1 | 3/2006 | Masuda et al. | |
| 2007/0070093 A1* | 3/2007 | Lin et al. ....................... 345/694 |
| 2008/0224332 A1* | 9/2008 | Tam .............................. 257/786 |

FOREIGN PATENT DOCUMENTS
GB             242017 A      11/1925

OTHER PUBLICATIONS

Ong, http://www.laserfocusworld.com/display_article/206960/12/none/none/Feat/Semiconductor-ink-advances-flexible-displays, posted Jun. 1, 2006.*
Arias et al., Appl. Phys. Letters, v. 85, No. 15, pp. 3304-3306.*
Ong, "Semiconductor ink advances flexible displays", *Laser Focus World*, Jun. 1, 2004.
Street et al., "Jet printing flexible displays", *Materials Today*, vol. 9, Issue 4, pp. 32-37, Apr. 2006.

* cited by examiner

*Primary Examiner* — N Drew Richards
*Assistant Examiner* — Yu-Hsi Sun
(74) *Attorney, Agent, or Firm* — Oliff & Berridge, PLC

(57) ABSTRACT

A specially designed mask controls the arrangement of conductive materials that form a source and drain of a transistor. Designing the mask can be costly and time-consuming, which means that the testing of a circuit involving a transistor can also be costly, time consuming and a barrier towards efficient circuit development and testing. Accordingly, the present invention provides a pre-fabricated, general-purpose pattern comprising an array of conductive islands. The pattern is used as a source and a drain terminal for the formation of a thin-film transistor and as a conductive source for the formation of other electrical components upon the array.

12 Claims, 10 Drawing Sheets

TRANSISTOR CIRCUIT FORMATION SUBSTRATE

BACKGROUND

Several aspects of the present invention relate, in general, to a pre-fabricated, general-purpose pattern comprising an array of conductive islands. For example, the present invention provides a pattern that can be used as a source and a drain terminal for the formation of a transistor and as a conductive source for the formation of other electrical components upon the array.

Electronic circuit development typically involves a first stage of obtaining a schematic and running a circuit simulation of the schematic in software in order to obtain performance statistics. The schematic is translated into a physical layout and, following parasitic extraction, simulations for the back annotated schematic are re-run to determine whether the circuit performs according to required tolerances. In the field of organic thin-film transistors (OTFTs) among others, suitable software is lacking to model such devices and therefore in order to determine the operational characteristics of a circuit including such devices, it is necessary to physically build and test the circuit accordingly.

SUMMARY

FIG. 1 illustrates five different process flows, with and without the use of ink jet technology, for fabricating top-gate bottom-contact OTFTs of a type commonly used in the field of organic electronic devices. The process flow is divided into four main stages: source and drain terminal formation, channel formation, dielectric formation and gate formation. The source and drain terminal formation stage provides a basis for the subsequent variation in process flow. A blank insulating substrate (e.g. quartz, glass, plastic, ceramic, etc.) is provided with or without an underlying insulating buffer layer and the source and drain terminals of each transistor are individually arranged upon the substrate using conductive materials including metal (e.g. gold), organic conductive materials (e.g. PEDOT) and ceramics (e.g. ITO). A specially designed mask provides the arrangement and placing of conductive materials that form the source and drain terminals of transistors, connection tracks and contact pads in a circuit. Designing the mask can be costly and time-consuming, which means that the development of a more complex circuit involving an OTFT, for example, is also costly, time consuming. It is therefore desirable to provide a way of performing efficient evaluation and debugging of new and intermediate circuits and speeding up the entire circuit development cycle.

According to a first aspect of the present invention, there is provided a transistor circuit formation substrate comprising an insulating substrate, and a plurality of conductive islands positioned over the substrate, the plurality of conductive islands being disposed apart from one another such that a channel of a transistor can be formed by depositing a semiconductor material on and between the two adjacent islands of the plurality of conductive islands.

Preferably, the islands are tessellated over a substantial part of the substrate and more preferably they are provided in a plurality of columns, the islands in adjacent columns being offset from one another. It is further preferred that the islands in alternate columns be aligned with one another. The islands may all have the same shape.

The substrate can be used to form electrical circuits, for example by ink jetting other components of the circuits.

According to another aspect of the present invention, there is provided an insulating substrate provided with a layer of patterned conductive islands, wherein a number of the conductive islands are provided on the insulating substrate in a three-grouping arrangement.

Preferably, the conductive islands are arranged in a series of columns.

It is preferred in both aspects that adjacent columns in the series of columns are separated by a spaced distance of around 1 to 100 μm. It is also preferred that individual conductive islands in a column are separated from adjacent conductive islands in the column by a spaced distance of around 1 to 100 μm.

The conductive islands may be rectangular shaped, T-shaped or hexagonal shaped. They may also comprise gold conductive material.

It is preferred that the pattern is regular and substantially repeated across the layer.

In both aspects, the present invention may provide a thin-film transistor having a layer of semiconductor material deposited upon and between a pair of adjacent conductive islands, wherein the channel width of the transistor is determined by WA/LY, where WA is the width of the semiconductor material and LY is the spaced distance between adjacent conductive islands in a column.

According to another aspect of the present invention, there is provided a method of manufacturing a transistor comprising:

providing a plurality of conductive islands over a substrate in a three-grouping arrangement;

depositing a semiconductor material upon and between adjacent conductive islands of the plurality of conductive islands;

depositing an insulator upon the semiconductor material; and depositing a gate upon the insulator.

Preferably, the conductive islands are arranged in a series of columns. Preferably, adjacent columns in the series of columns are separated by a spaced distance of around 1 to 100 μm. Preferably, depositing is performed using an inkjet head. Preferably, a spaced distance of greater than 100 μm separates adjacent columns in the series of columns. Preferably, depositing the insulator is provided by spin coating.

According to another aspect of the present invention, there is provided a method of fabricating a layer of patterned conductive islands comprising:

coating a base layer with an insulating substrate;

stamping a pattern of conductive islands upon the insulating substrate, wherein a number of the conductive islands are provided on the insulating substrate in a three-grouping arrangement.

BRIEF DESCRIPTION OF THE FIGURES

Embodiments of the present invention will now be described by way of further example only and with reference to the accompanying drawings, in which.

EMBODIMENTS

Figure 1:
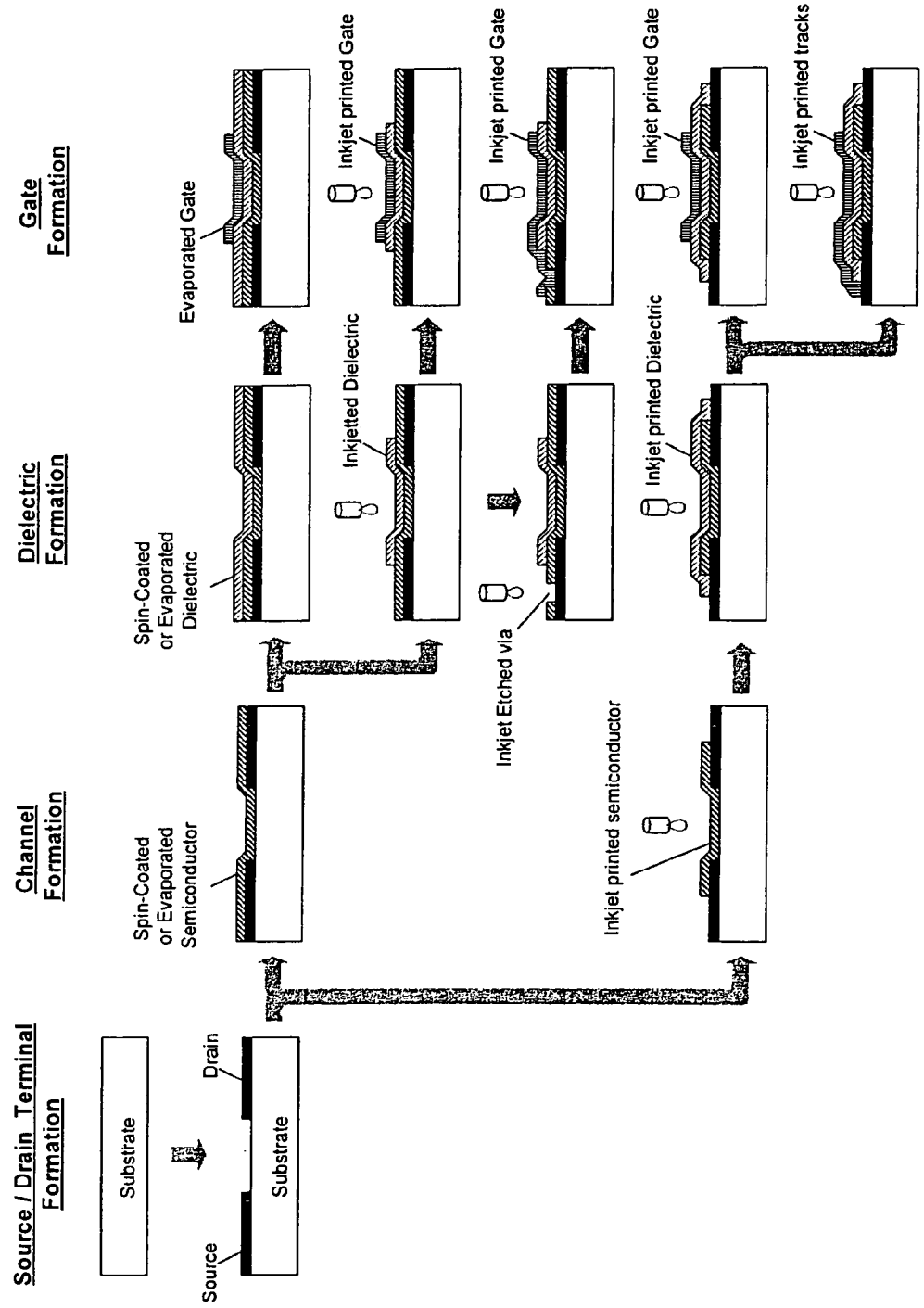
FIG. 1 is a schematic diagram of a typical process flow for manufacturing a top-gate Organic Thin-Film Transistor.

Throughout the following description like reference numerals will be used to identify like parts.

Figure 2:
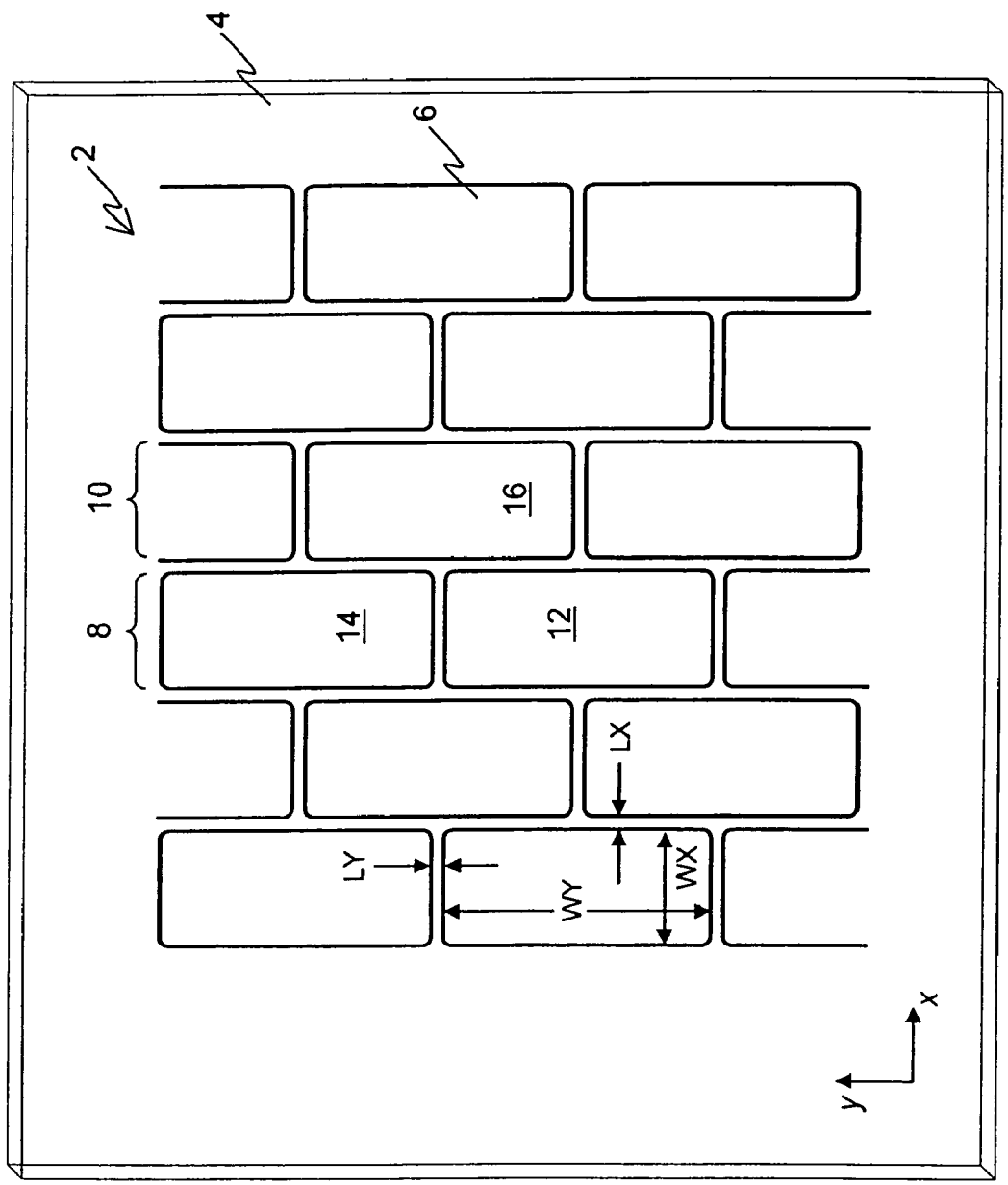
FIG. 2 is a schematic diagram of a terminal conductor pre-pattern according to the present invention.

Referring to FIG. 2, a layer of patterned conductive material 2 is disposed upon an insulating substrate 4. The conductive material of thickness range from 1 nm to 1 μm is arranged in rectangular shaped conductive islands 6 of width WX and length WY. Each conductive island 6 is spaced from an adjacent conductive island 6 along its length by a distance LX and spaced along its width by a distance LY. The distances LX and LY range from around 1 to 100 μm, whilst the distances WX and WY are any suitable aspect ratio with WY being up to the order of millimetres.

In FIG. 2 the patterned conductive material 2 is arranged in a series of six columns of conductive islands 6. A first column 8 comprises at least three conductive islands 6 separated from a second column 10 by the spaced distance LX. The second column 10 also comprises at least three conductive islands 6. Individual conductive islands 6 in each of the first and second columns 8, 10 are spaced from one another by the distance LY. The second column 10 is positionally shifted with respect to the first column 8 so that the spaced distance LY between individual conductive islands 6 in the first and second columns 8, 10 is not continuous in a row direction across the first and second columns 8, 10. Referring to FIG. 2, the spaced distance LY between a first conductive island 12 and a second conductive island 14 is adjacent a third conductive island 16 of the second column 10. This arrangement is referred to as a three-grouping arrangement.

Figure 3:
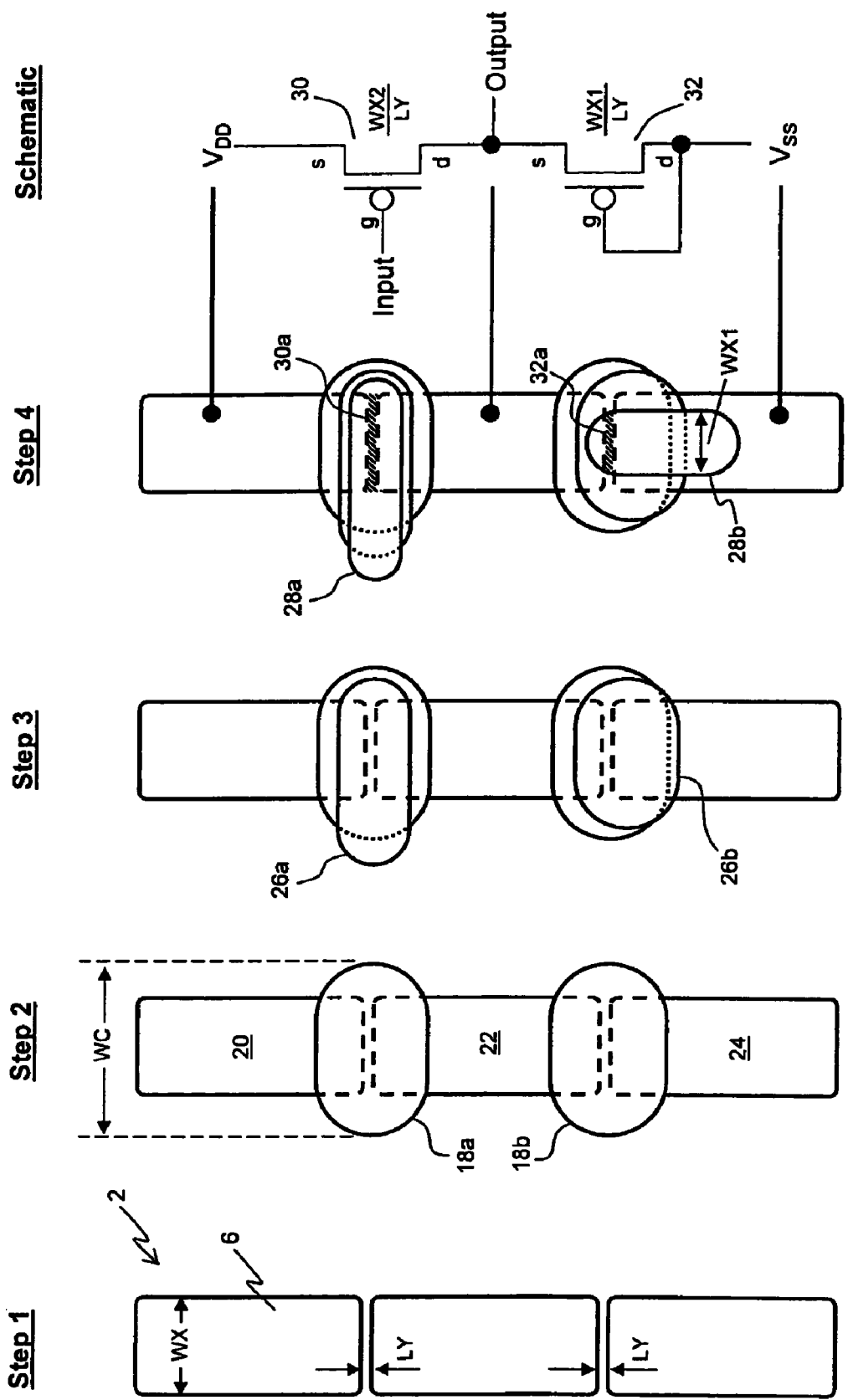
FIG. 3 is a schematic diagram of a process flow for the manufacture of an inverter according to the present invention.

FIG. 3 is a schematic diagram of a process flow for the manufacture of an inverter according to the present invention.

In Step 1, the insulating substrate 4 with conductive islands 6 is provided in a form, for example as in FIG. 2, suitable for having a semiconductor material 18 deposited thereupon. In Step 2, a first area of semiconductor material 18a is inkjet deposited upon the conductive material 2 to overlap the spaced distance LY between individual conductive islands 20 and 22. A second area of semiconductor material 18b is inkjet deposited upon the conductive material 2 to overlap the spaced distance LY between individual conductive islands 22 and 24. The width (dimension WC) of semiconductor material 18a, 18b deposited is greater than the width WX of the conductive island 6 in the present embodiment. It is not essential that the semiconductor material lies on the top surface of the conductive islands, only that it is deposited upon and between the conductive islands 6 to the extent that it at least contacts the islands and forms a continuous connection between them.

In Step 3, a first area of dielectric material 26a is inkjet deposited over the semiconductor material 18a. Also in Step 3, a second area of dielectric material 26b is inkjet deposited over the second area of semiconductor material 18b, with a portion extended outside the area covered by the semiconductor material 18b applied in Step 2 so as to encroach further upon the conductive island 24.

In Step 4, a first gate 28a is inkjet deposited over the first area of dielectric material 26a, with a portion extended outside the area covered by the dielectric material 26a applied in Step 3. A second gate 28b of width WX1 is inkjet deposited over the second area of dielectric material 26b, with a portion extended outside the area covered by the dielectric material applied in Step 3 so as to encroach further upon the conductive island 24. The active channel regions are indicated by the hashed area. The figure shows that a portion of the dielectric material 26a extending outside the area covered by the semiconductor material 18a applied in Step 2. However, this is not essential if the gate 28a does not extend outside the area covered by the dielectric material.

A schematic circuit diagram in FIG. 3 illustrates the circuit configuration realised by the manufacture of the inverter according to the present invention. The circuit diagram comprises a first p-type transistor (the driver) 30, corresponding to the active region 30a in Step 4, connected to a second diode-connected p-type transistor (the load) 32, corresponding to the active region 32a in Step 4, as is known in the art. In the present case, the effective channel widths and channel lengths for the first transistor 30 are determined by the dimensions WX and LY, respectively, and those for the second transistors 32 are determined by the dimensions WX1 and LY, respectively, where WX1 is the width of the material forming the second gate 28b. This is explained in more detail with reference to FIG. 4 below.

Figure 4:
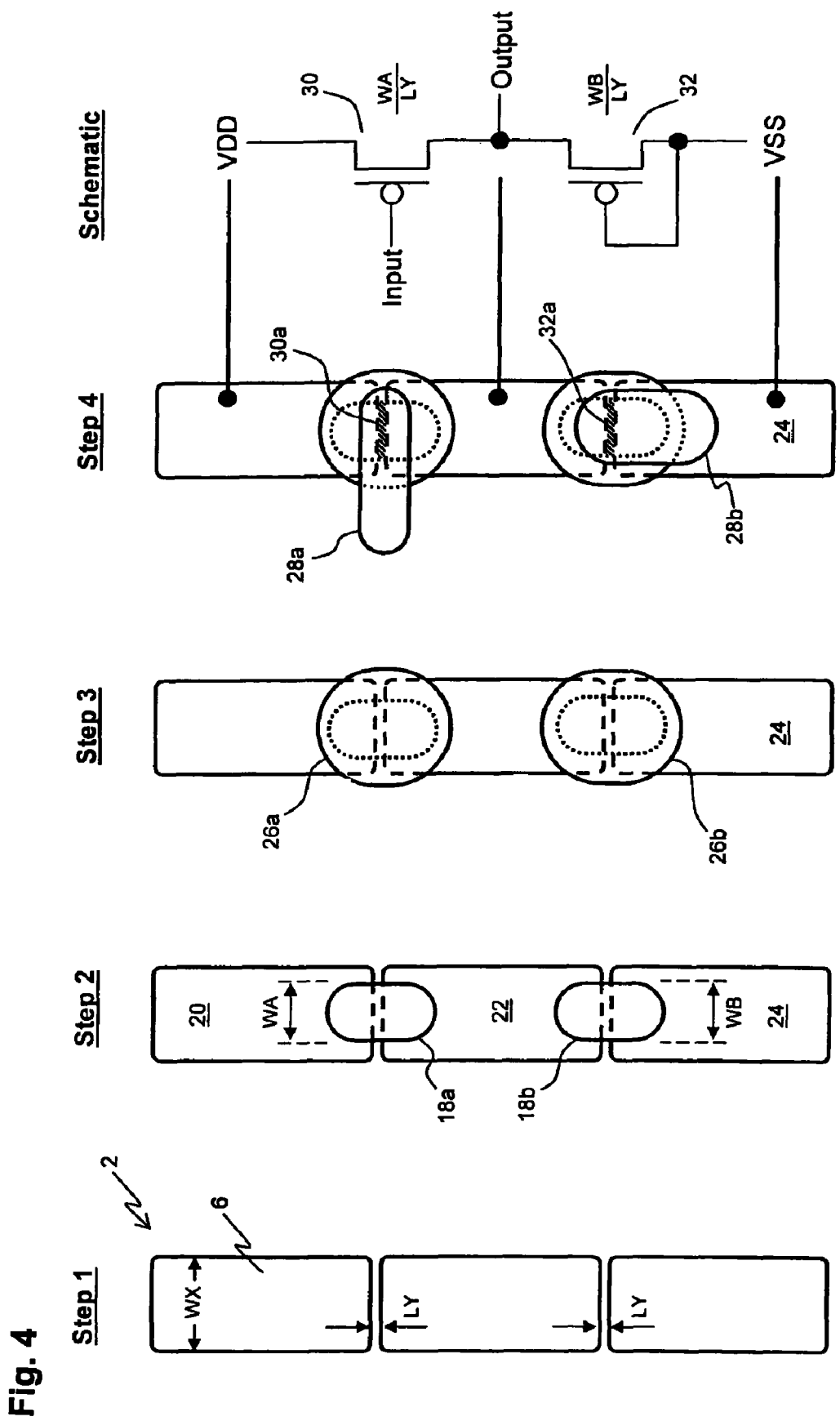
FIG. 4 is a schematic diagram of a process flow for the manufacture of an inverter according to the present invention.

FIG. 4 is a schematic diagram of a process flow for the manufacture of an inverter according to the present invention. A channel width less than WX is obtainable if the inkjet line width of the area of semiconductor material 18 deposited in the space between conductive islands 6 is reduced.

In Step 1, the insulating substrate with conductive islands 6 is provided in a form, for example as in FIG. 2, suitable for having the semiconductor material 18 deposited thereupon. In Step 2, a first area of semiconductor material 18a is inkjet deposited upon the conductive material 2 to overlap the spaced distance LY between individual conductive islands 20 and 22. A second area of semiconductor material 18b is inkjet deposited upon the conductive material 2 to overlap the spaced distance LY between individual conductive islands 22 and 24. The width (dimensions WA, WB) of semiconductor material 18a, 18b deposited is less than the width WX of the conductive island 6 in the present embodiment.

In Step 3, a first area of insulator material acting as a dielectric 26a is inkjet deposited over the semiconductor material 18a, with a portion extended outside the area covered by the semiconductor material 18a applied in Step 2. Also in Step 3, a second area of insulator material acting as a dielectric material 26b is inkjet deposited over the second area of semiconductor material 18b, with a portion extended outside the area covered by the semiconductor material 18b applied in Step 2 so as to encroach further upon the conductive island 24.

In Step 4, a first gate 28a is inkjet deposited over the first area of dielectric material 26a, with a portion extended outside the area covered by the dielectric material 26a applied in Step 3. A second gate 28b is inkjet deposited over the second area of dielectric material 26b, with a portion extended outside the area covered by the dielectric material applied in Step 3 so as to encroach further upon the conductive island 24.

Again, the figure shows that a portion of the dielectric material 26a, 26b extending outside the area covered by the semiconductor material 18a, 18b applied in Step 2. However, this is not essential if the gate 28a, 28b does not extend outside the area covered by the dielectric material.

A schematic circuit diagram in FIG. 4 illustrates the circuit configuration realised by the manufacture of the inverter according to the present invention. The circuit diagram comprises a first p-type transistor 30 connected to a second diode-connected p-type transistor 32 as is known in the art. In the present case, the effective channel width of the first and second transistors 30, 32 is determined by the dimensions WA and WB. The channel length remains LY.

Figure 5:
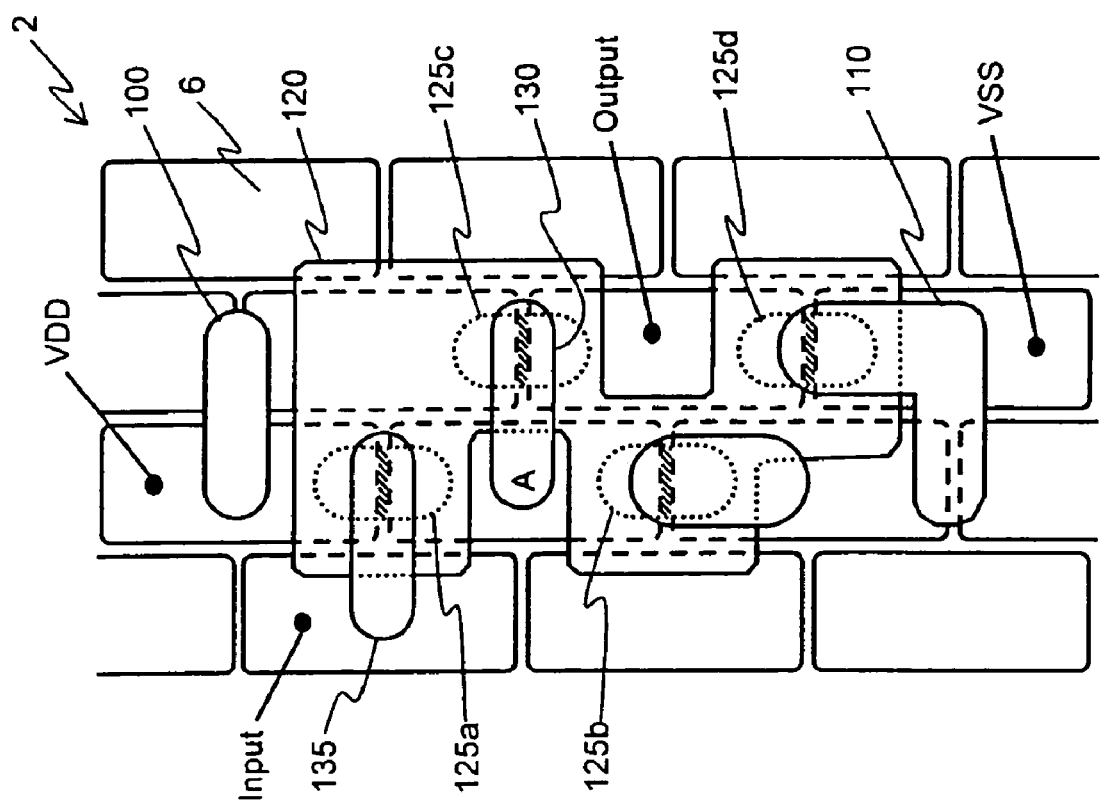
FIG. 5 is a schematic diagram illustrating two inverters in series.
Figure 5:
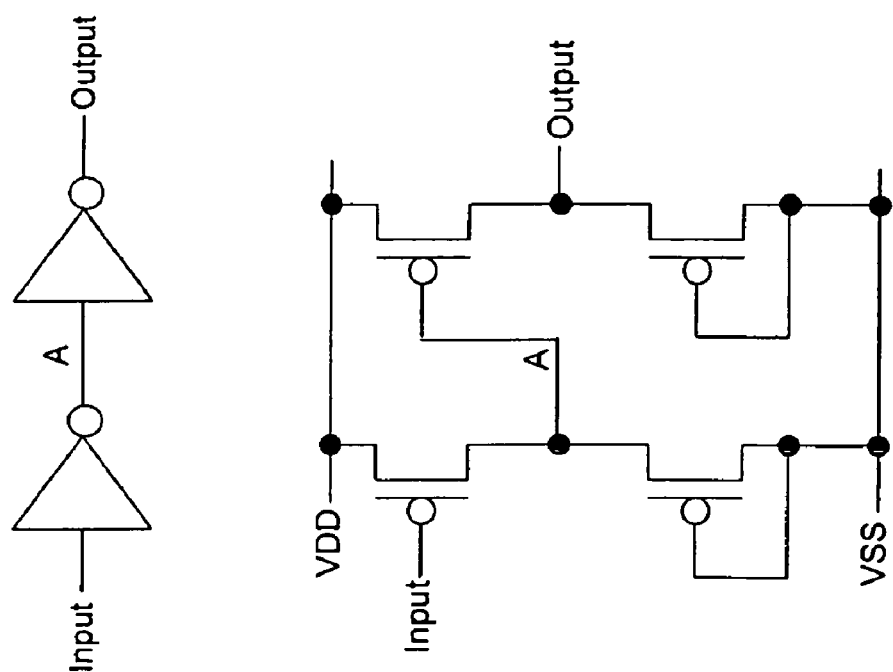

Referring to FIG. 5, a schematic diagram illustrating two inverters in series comprises the terminal conductor pre-pattern according to the present invention as a base. The p-type transistors are inkjet printed upon the base as described with reference to FIG. 4 and arranged as known in the art to provide two inverters in series.

In FIG. 5 it can be seen that one inverter comprises transistors formed using conductive islands in the column second from the left and the other inverter comprises formed using conductive islands in the column second from the right. A strip of conductive material 100 is deposited across the two columns at the top to allow a common rail to be formed, with the same voltage VDD applied to both inverters. Similarly, a strip of conductive material 110 is deposited across the two columns at the bottom to allow a second common rail to be formed, with the voltage VSS applied to both inverters. It is also worth noting that in this embodiment a single film of insulating or dielectric material 120 is deposited to cover the semiconductor material 125 deposited with appropriate widths to form the channels of the respective four transistors. A strip of conductive material 130 is deposited to connect the output of the first inverter to the gate of the upper transistor in the second inverter. A further strip 135 of conductive material is deposited to connect the gate of the upper transistor of the first inverter to a separate conductive island to allow easier connection to the circuit.

Figure 6:
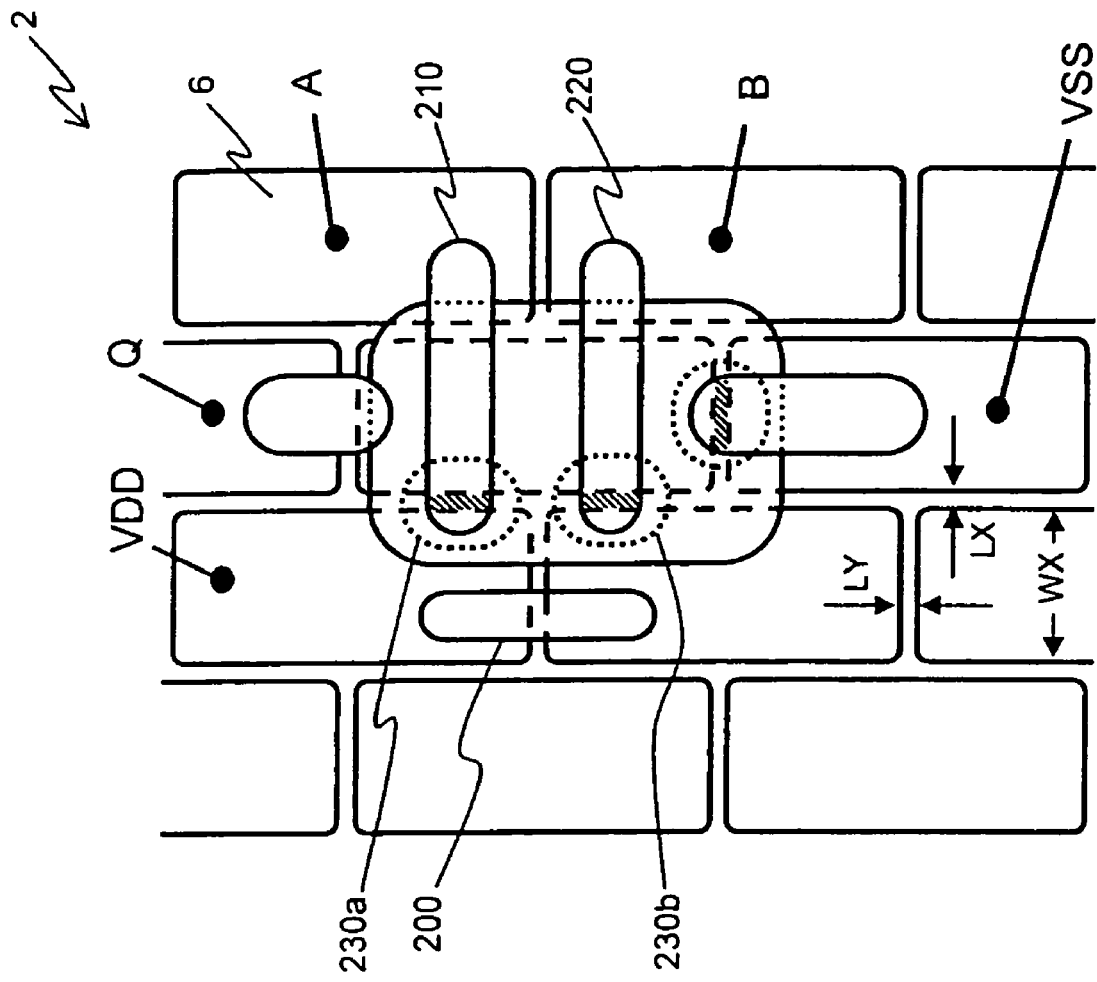
FIG. 6 is a schematic diagram of a NAND gate according to the present invention.
Figure 6:
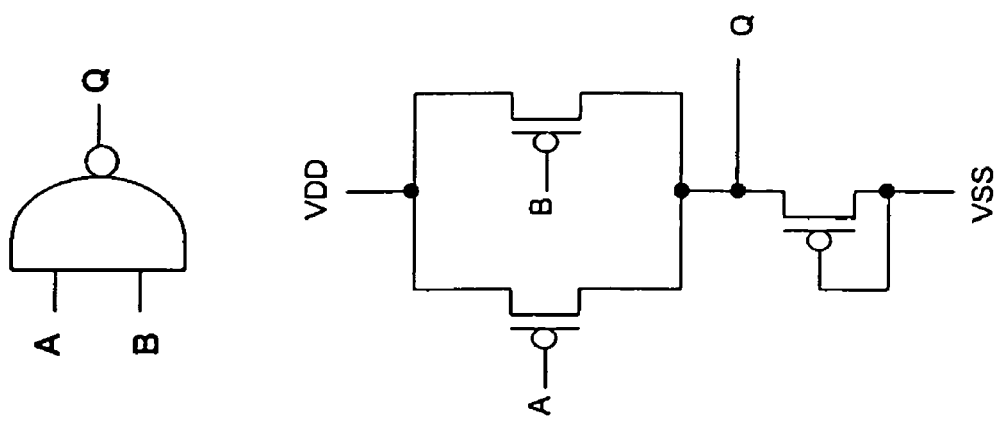

Referring to FIG. 6, a schematic diagram of a NAND gate according to the present invention comprises the terminal conductor pre-pattern described above as a base. The p-type transistors are deposited upon the metal conductive islands 2 as described with reference to FIG. 4 and arranged as known in the art to provide the NAND gate.

Whereas in FIG. 5 the transistors are all formed using conductive islands above and below one another, in FIG. 6 the two transistors in parallel are formed using conductive islands to the left and right of one another. The third series transistor is disposed from top to bottom, as before. Thus, a strip 200 of conductive material runs downwards to connect two islands in a column together and therefore form a common rail by which a voltage VDD can be applied to the sources of the two transistors in parallel. Separate strips 230 of semiconductor material are disposed in the gap between the two connected islands on the one hand and the adjacent island to the right, which forms a set of islands in a "three-grouping" arrangement, on the other hand. Thus, the set of islands forms a common drain for the two transistors in parallel. The third series transistor is formed as shown before, and again a single region of insulating material is used to cover all the semiconductor material. Gate electrodes for the two transistors in parallel are formed by conductive strips 210, 220, again allowing easier connection to the circuit. The third transistor is diode connected as before.

Figure 7:
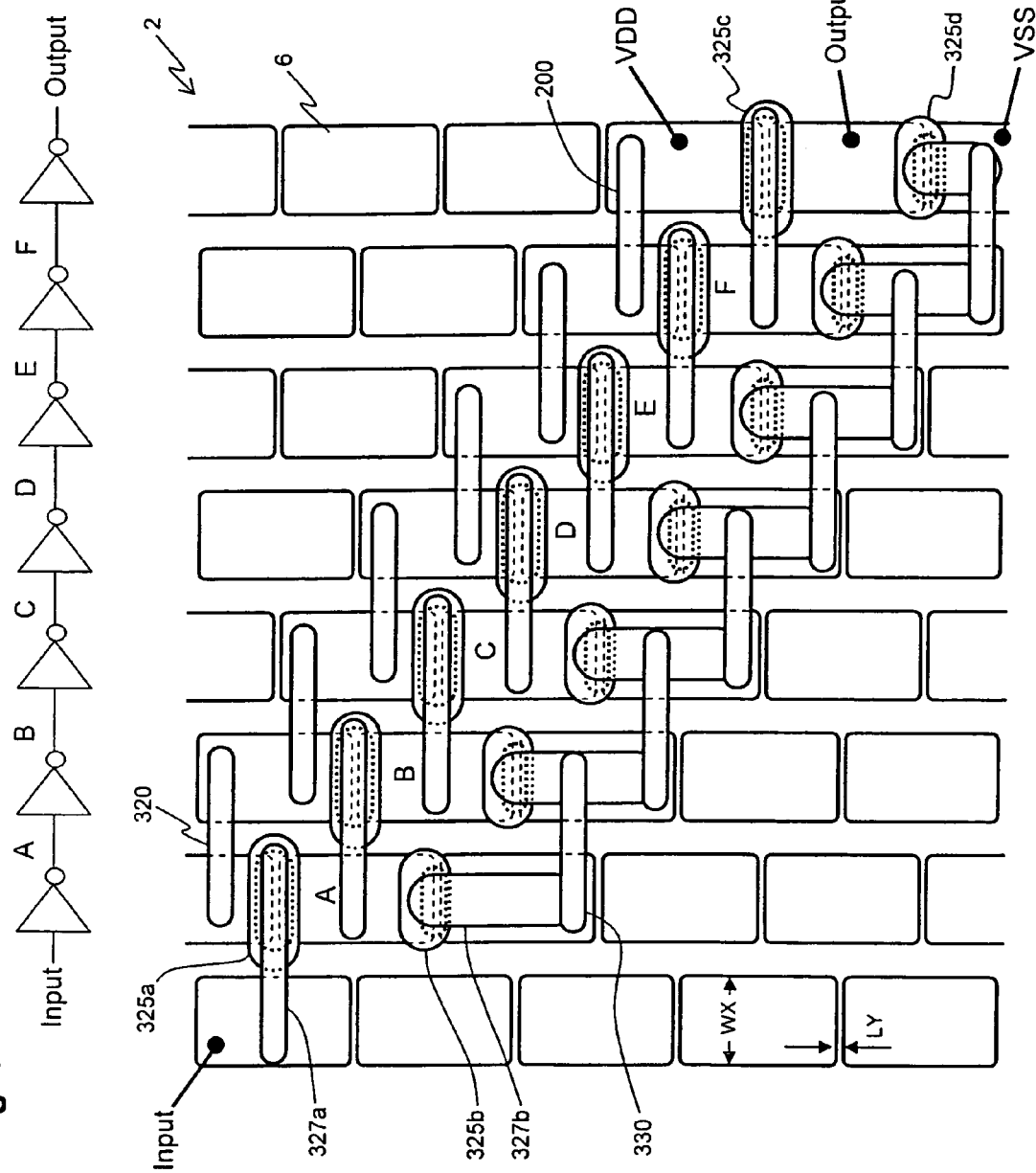
FIG. 7 is a schematic diagram of a delay line of a delay line consisting of 7 serially connected inverters according to the present invention.
Figure 8:
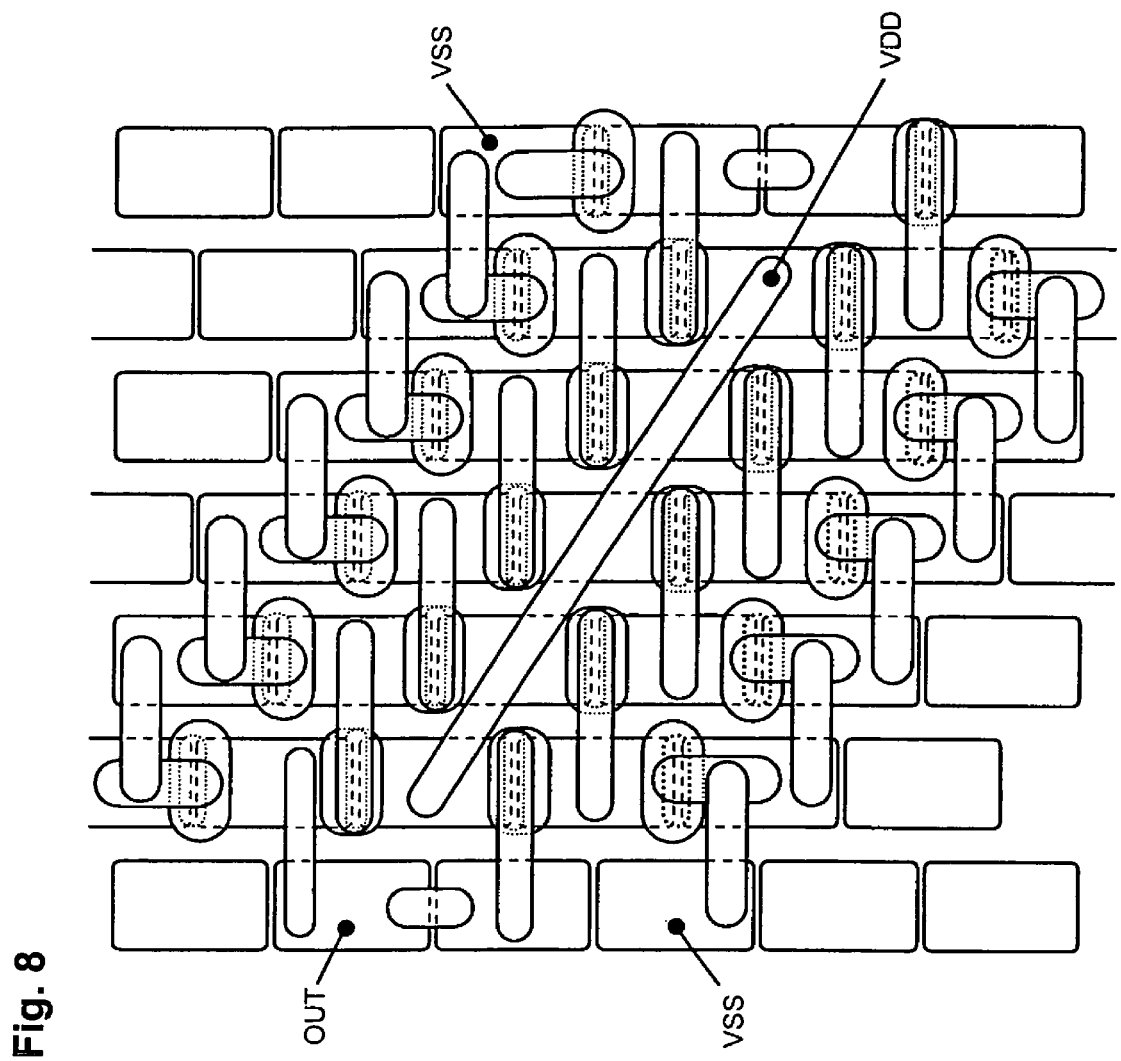
FIG. 8 is a schematic diagram of an 11-stage ring oscillator according to the present invention.

It should be apparent to a person skilled in the art that further detailed circuit embodiments are enabled using the above-described terminal conductor pre-pattern as a base and employing the inkjet deposition process as described with reference to FIG. 3 and FIG. 4. In particular, a delay line of 7 inverters according to the present invention is illustrated in FIG. 7 and FIG. 8 is an illustration of an 11-stage ring oscillator.

Alternative embodiments are envisaged to be within the scope of the present invention. In particular, although the above circuits have been described with reference to p-type transistors, n-type transistors can be arranged upon the patterned conductive material 2. Other electrical components providing, for example, impedance and capacitance functionality can also be provided.

Other arrangements of the conductive islands 6 are possible, whether three-grouping or not. Preferably, the conductive islands 6 are tessellated. Where the preferred three-grouping arrangement is used, a portion of the pattern should be arranged so that the spacing in at least one direction between respective individual islands is not continuous in the direction along which the spacing extends. Thus, with reference to FIG. 2, conductive islands 12 and 14 are spaced apart in the y direction, with the spacing running in the x direction. However, the spacing LY is not continuous in the x direction and is instead interrupted by island 16. The spacing running in the y direction is continuous in this case.

Figure 9:
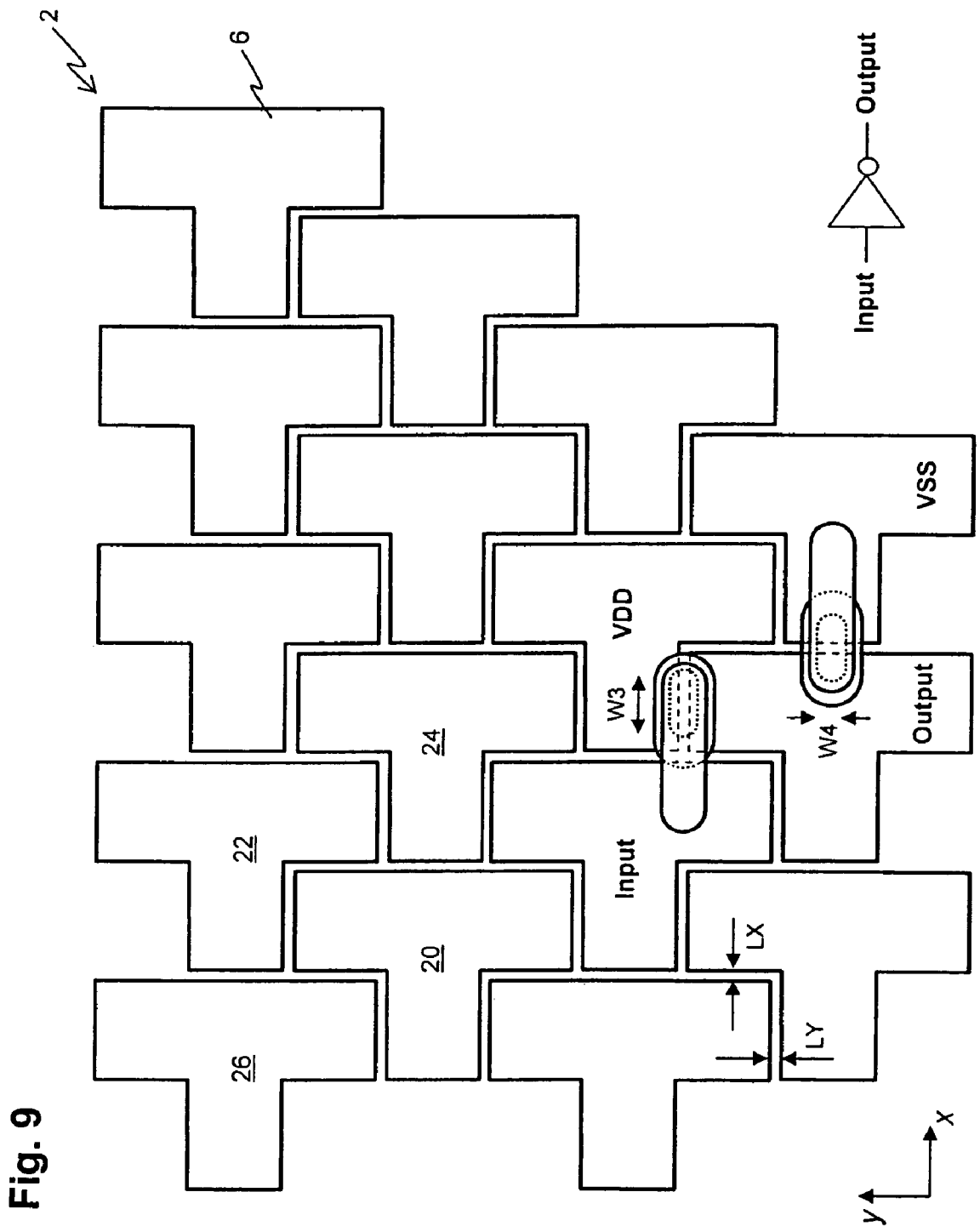
FIG. 9 is a schematic diagram of a terminal conductor pre-pattern according to the present invention.

FIG. 9 illustrates another example of a tessellated pattern, using T-shaped conductive islands, which may be particularly advantageous for certain types of circuit. In this case a portion of the pattern is arranged so that the spacing in two directions between respective individual islands is not continuous in the direction along which the spacing extends. More specifically, island 20 is spaced apart from island 22 in the y direction, with the spacing extending in the x direction. However, the spacing does not extend continuously but is instead interrupted by island 26, as well as a portion of island 22 itself. Similarly, island 20 is spaced apart from island 24 in the x direction, with the spacing extending in the y direction. However, the spacing does not extend continuously but is instead interrupted by island 22.

Figure 10:
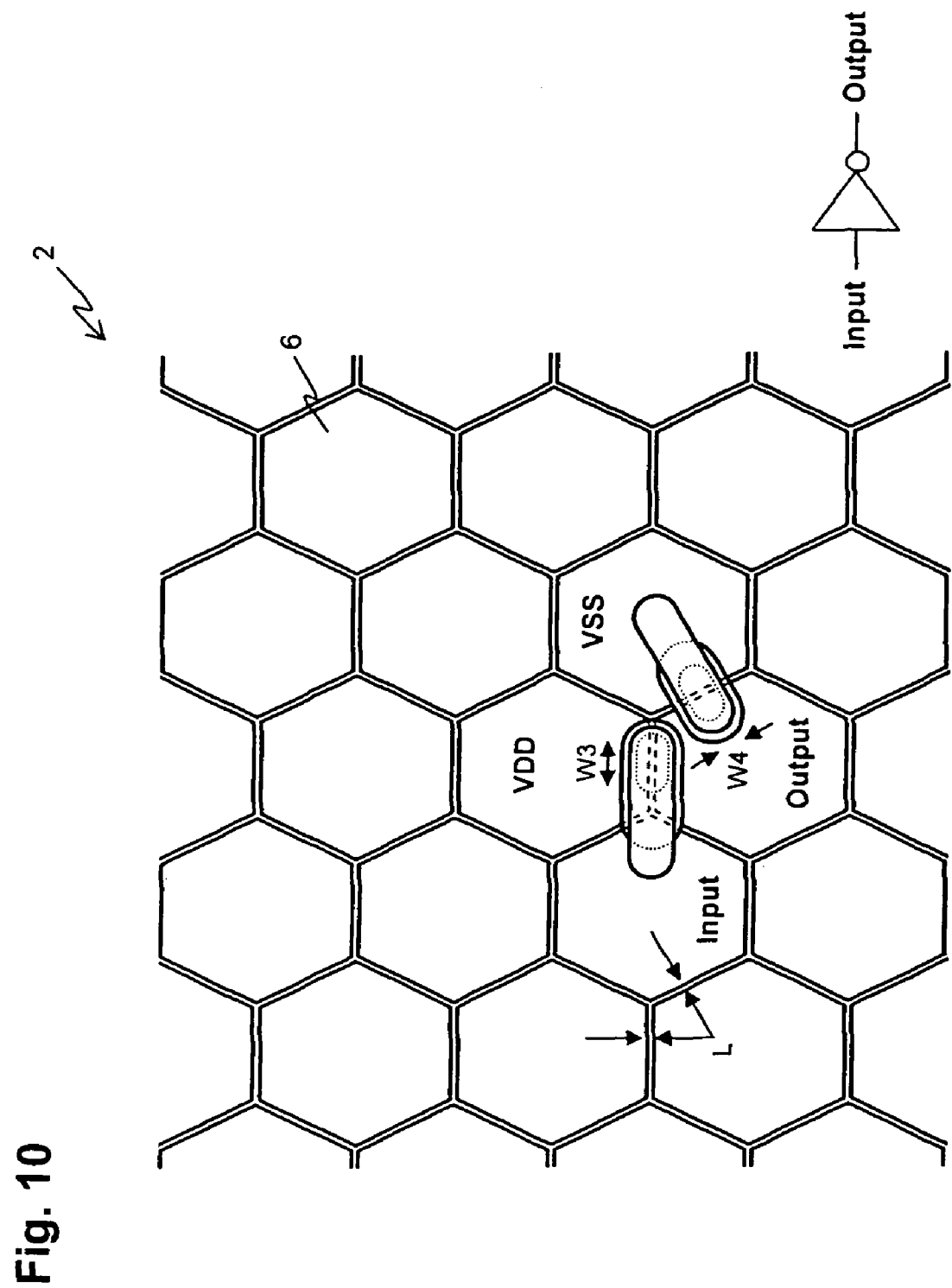
FIG. 10 is a schematic diagram of another terminal conductor pre-pattern according to the present invention.

It is not an essential requirement of the present invention to have a regular pattern of conductive islands 6 and the individual shapes of the conductive islands 6 may be varied to suit user requirements. Possible other shapes include circles, ovoids, rhombuses, squares, crosses, stars and so forth, and although shapes with at least some straight edges are preferred, this is non-limiting. Of course, more than one shape may be used to form the conductive islands on a single substrate. For example, squares and crosses could be interspersed. FIG. 10 illustrates an example of a pattern of conductive islands with hexagonal shape separated by a distance L. An example of an inverter fabricated with reference to FIG. 4 is also shown.

The pattern can be obtained, for example, by photo-lithography, stamping and moulding although any suitable method can be used. In particular, manufacture of the pattern is well suited to flexible substrates in general and to reel-to-reel processes in particular. The conductive material can be gold or any conductive material compatible with the semiconductor material of choice.

Whilst inkjet printing technology is well suited as a means to deposit material upon the conductive islands, the present invention permits a use of spin coating in combination with or as an alternative to inkjet printing. For spin coating of the semiconductor material, the dimension LX is provided greater than around 100 μm. This spacing allows sufficient resistance to isolate gates in neighbouring conductive islands 6. The step of spin coating would preferably be followed by an inkjet etching step. For example, in order to prepare the 11-stage ring oscillator as illustrated in FIG. 8, a first step can include inkjet depositing of a semiconductor material followed by a second step of spin coating in order to provide the insulating material. A third step can include an inkjet etching step to create a via-hole and a fourth step can include an inkjet deposit of a gate.

The foregoing description has been given by way of example only and a person skilled in the art will appreciate that modifications can be made without departing from the scope of the present invention.

The invention claimed is:

1. A transistor circuit formation substrate, comprising:
a substrate;
a plurality of conductive islands positioned over the substrate;
a first semiconductor material disposed between a first conductive island among the plurality of conductive islands and a second conductive island among the plurality of conductive islands; and
a second semiconductor material disposed between a third conductive island among the plurality of conductive islands and a fourth conductive island among the plurality of conductive islands;
the first conductive island and the second conductive island being provided in a first column,
the third conductive island and the fourth conductive island being provided in a second column that is adjacent to the first column,
each of the conductive islands in the first column being offset from each of the conductive islands in the second column,
the first conductive island and the third conductive island thereby being offset in a direction crossing the first column and the second column, and the second conductive island and the fourth conductive island thereby being offset in a direction crossing the first column and the second column,
wherein a dielectric material is disposed over the first semiconductor material and a gate is disposed over the dielectric material.

2. The transistor circuit formation substrate according to claim 1, the plurality of conductive islands being tessellated over the substrate.

3. The transistor circuit formation substrate according to claim 1, the plurality of conductive islands being provided in a plurality of columns, each of conductive islands within a column being offset from each of conductive islands within adjacent columns.

4. The transistor circuit formation substrate according to claim 3, adjacent columns in the series of the plurality of columns being separated by a spaced distance of around 1 to 100 μm.

5. The transistor circuit formation substrate according to claim 3, individual conductive islands of the plurality of conductive islands in one column of the plurality of columns being separated from adjacent conductive islands in the one column by a spaced distance of around 1 to 100 μm.

6. The transistor circuit formation substrate according to claim 1, the plurality of conductive islands being provided in a plurality of columns, the plurality of conductive islands in alternate columns being aligned with one another.

7. The transistor circuit formation substrate according to claim 1, all of the plurality of conductive islands having the same shape.

8. The transistor circuit formation substrate according to claim 1, the plurality of conductive islands being at least one of rectangular shaped, T-shaped and hexagonal shaped.

9. The transistor circuit formation substrate according to claim 1, each of the plurality of conductive islands including a gold conductive material.

10. The transistor circuit formation substrate according to claim 1, a pattern of the plurality of conductive islands being regular and substantially repeated across the substrate.

11. The transistor circuit formation substrate according to claim 1, each of the first and the second semiconductor materials forming a channel of transistor, the channel width of the transistor being determined by the width of the semiconductor material WA disposed over the spaced distance LY between adjacent conductive islands of the plurality of conductive islands in a column.

12. The transistor circuit formation substrate according to claim 1, wherein the conductive islands act as electrodes.

* * * * *